United States Patent
Chen

(10) Patent No.: US 8,558,197 B2
(45) Date of Patent: Oct. 15, 2013

(54) ION IMPLANTING SYSTEM

(75) Inventor: Heng-Gung Chen, Hsinchu (TW)

(73) Assignee: Advanced Ion Beam Technology, Inc., Hsnichu (TW)

( * ) Notice: Subject to any disclaimer, the term of this patent is extended or adjusted under 35 U.S.C. 154(b) by 190 days.

(21) Appl. No.: 12/882,432

(22) Filed: Sep. 15, 2010

(65) Prior Publication Data

US 2012/0061560 A1 Mar. 15, 2012

(51) Int. Cl.
*G21G 5/00* (2006.01)

(52) U.S. Cl.
USPC .................. 250/492.3; 250/492.1; 250/492.2; 250/492.21; 250/492.22

(58) Field of Classification Search
USPC ........................................... 250/492.1–492.3
See application file for complete search history.

(56) References Cited

U.S. PATENT DOCUMENTS

2006/0289800 A1 * 12/2006 Murrell et al. .......... 250/492.21
2007/0145298 A1 * 6/2007 Freer et al. .............. 250/492.21
2011/0073777 A1 * 3/2011 Pandolfi .................... 250/492.3

FOREIGN PATENT DOCUMENTS

EP 854494 A2 * 7/1998

* cited by examiner

*Primary Examiner* — Michael Maskell
(74) *Attorney, Agent, or Firm* — Rosenberg, Klein & Lee

(57) ABSTRACT

An ion implanting system includes an ion beam generator configured for generating a first ion beam; a mass separation device configured for isolating a second ion beam including required ions from the first ion beam; a holder device configured for holding a plurality of substrates, wherein the holder device and the second ion beam reciprocate relative to each other along a first direction in straight line or arc to make the plurality of substrates pass across a projection region of the second ion beam; and a first detector configured for obtaining relevant parameters of the second ion beam. The above ion beam implanting system may increase the ion beam utilization rate. The ion implanting system further comprises a second detector arranged on the holder device which could fully scan across the projection range of the second ion beam and obtaining the relevant parameters of the second ion beam.

12 Claims, 4 Drawing Sheets

# ION IMPLANTING SYSTEM

BACKGROUND OF THE INVENTION

1. Field of the Invention

The present invention is related to an ion implanting system, and more particularly to an ion implanting system which improves utilization rate of ion.

2. Description of the Prior Art

In a fabrication process for integrated circuits, an ion implanting system is for implanting an impurity into a semiconductor material. A prior art ion implanting process includes ionizing a required impurity element, selecting the ions with a desired mass/charge ratio, targeting the selected ions toward a substrate, such as a semiconductor wafer, and implanting the impurity element into the substrate.

Referring to FIG. 1, a prior art ion implanting system is configured with a holder device 11 to hold a plurality of circularly arranged substrates 100. During an ion implanting process, the holder device 11 either rotates in a clock wise direction or counter clock wise direction, and an ion beam moves along the radial direction of the holder device 11 to scan across the whole semiconductor substrate 100. Since the rotational speed of the holder device 11 is faster and, as the device scale continue to shrink, particles in the chamber may easily cause device wafer polyline broken upon impact due to the relative motion between particle and spinning holder device 11.

Another prior art ion implanting system handles a single substrate at a time. By moving the substrate or deflecting the ion beam, the ion beam can scan across the whole substrate. As shown in FIG. 2, in order to ensure the ion beam scanning across the whole substrate 100, the ion beam must pass across the whole substrate 100. The distance D1 illustrated in FIG. 2 leaves a buffer zone for ion beam to scan off wafer, decelerating, accelerating and measuring the beam current when the scanning direction is changed. In such way, the scanning zone 200 of the ion beam, depending on beam size, could be significantly larger than the area of the substrate 100, and thus the utilization rate of the ion beam cannot be effectively increased.

Therefore, it is highly desirable to effectively increase the utilization rate of the ion beam.

SUMMARY OF THE INVENTION

The present invention is directed to an ion implanting system, particularly an ion implanting system performing an ion implanting process on a plurality of substrates arranged side by side. By omitting the buffer zone allotted for the scanning between the substrates, the utilization rate of the ion beam is increased.

In one embodiment, the proposed ion implanting system includes an ion beam generator, a mass separation device, a holder device and a first detector. The ion beam generator is configured for generating a first ion beam. The mass separation device is arranged at the downstream side of the first ion beam and configured for isolating a second ion beam including required ions from the first ion beam. The holder device is arranged at the downstream side of the second ion beam and configured for holding a plurality of substrates, wherein the holder device and the second ion beam linearly reciprocate relative to each other along a first direction to make the plurality of substrates pass across a projection region of the second ion beam while ion implanting, and the plurality of substrates are arranged side by side along the first direction. The first detector is arranged at the downstream side of the second ion beam and configured for obtaining relevant parameters of the second ion beam.

The objective, technologies, features and advantages of the present invention will become apparent from the following description in conjunction with the accompanying drawings wherein certain embodiments of the present invention are set forth by way of illustration and example.

DESCRIPTION OF THE PREFERRED EMBODIMENT

The detailed explanation of the present invention is described as follows. The preferred embodiments are presented for purposes of illustrations and description, and are not intended to limit the scope of the present invention.

Figure 3:
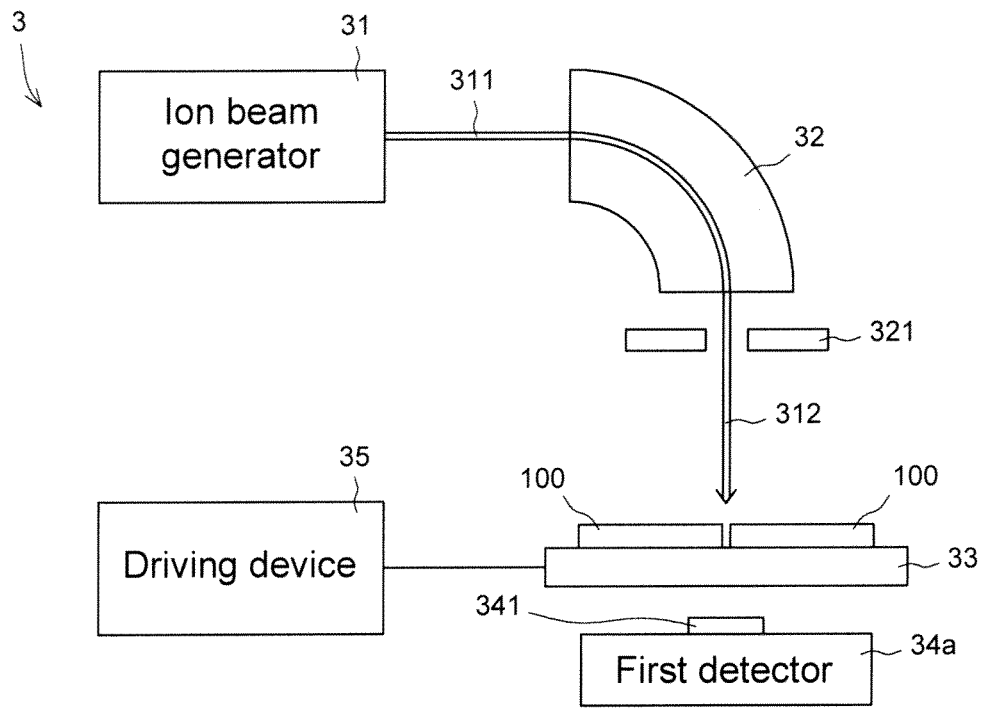
FIG. 3 is a diagram schematically illustrating an ion implanting system according to an embodiment of the present invention.

Referring to FIG. 3, the ion implanting system 3 according to an embodiment includes an ion beam generator 31, a mass separation device 32, a holder device 33, and a first detector 34a. The ion beam generator 31 is configured for generating a first ion beam 311. For example, the ion beam generator 31 ionizes the source ion gas in the plasma chamber by arc discharge induced electron bombardment or the like to produce plasma. Next, it extracts the ions from the plasma chamber to form a first ion beam 311. The mass separation device 32 is arranged on the downstream side of the first ion beam 311 for isolating a second ion beam 312 containing the required ions from the first ion beam 311. For example, the mass separation device 32 can deviate the ions with the desirable mass/charge ratio from the path of the first ion beam 311 by using magnetic field. The mass separation device 32 then applies a shield 321 to block the unwanted ions and allow only the desired ions to pass through to form a second ion beam 312. According to an embodiment, the second ion beam 312 may be ribbon-shaped or bell-shaped.

The holder device 33 is arranged on the downstream side of the second ion beam 312, and configured for holding a plurality of substrates 100. According to an embodiment, the substrate 100 may be a semiconductor wafer. The holder device 33 and the second ion beam 312 reciprocate relative to each other along a first direction, making the plurality of substrates 100 pass across the projection region of the second ion beam 312 in a reciprocating manner. In other words, the second ion bean 312 can scan across all the substrates 100. According to an embodiment, the holder device 33 is connected with a driving device 35. The driving device 35 drives the holder device 33 to reciprocate relative to the second ion beam 312 along the first direction, making the plurality of substrates 100 pass across the projection region of the second ion beam 312 in a reciprocating manner. Preferably, the driving device 35 also drives the holder device 33 to move along a second direction, making the second ion beam 312 scan across all the substrates 100. According to an embodiment, the first direction and the second direction are substantially perpendicular to each other, making the second ion beam 312 to comprehensively scan the plurality of substrates 100 along the left-right direction and the up-down direction. It is noted that the moving path of the substrates 100 along the first direction may be in straight line or arc.

Figure 5:
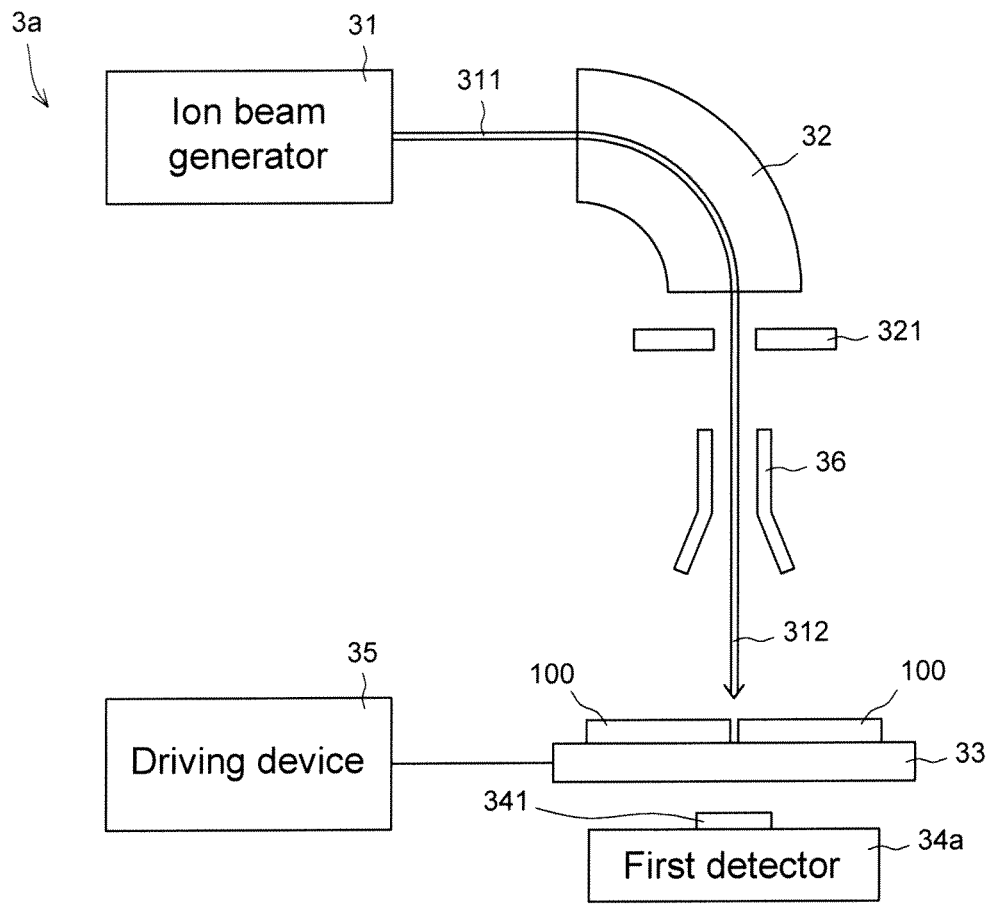
FIG. 5 is a diagram schematically illustrating an ion implanting system according to another embodiment of the present invention.

Referring to FIG. 5, according to another embodiment, the ion implanting system 3a includes a scanning device 36 arranged between the mass separation device 32 and the holder device 33. The scanning device 36 can deflect the second ion beam 312, making the second ion beam 312 scan the plurality of substrates 100 along left-right direction and up-down direction. Alternatively, the scanning device 36 deflects the second ion beam 312 toward left-right direction and a driving device 35, further included in the ion implanting system 3a, drives the holder device 33 to move along the up-down direction. With the relative motion between the second ion beam 312 and the holder device 33, the second ion beam 312 can comprehensively scan the plurality of substrates 100 along the left-right direction and the up-down direction. It should be noted that the foregoing second direction may be parallel, for the isocentric scan case, to the plane where the substrate lies, or at an angle to the plane for non-isocentric scan case.

Referring again to FIG. 3, the first detector 34a is arranged on the downstream side of the second ion beam 312, and configured for acquiring a relevant parameter of the second ion beam 312. For example, the relevant parameter of the second ion beam 312 may be parallelism, incident angle, ion beam density, ion beam profile shape of the second ion beam 312, or the combination thereof. According to an embodiment, the first detector 34a can be a Faraday cup arranged on the end behind the holder device 33. When the holder device 33 is not on the path of the second ion beam 312, the first detector 34a can obtain the relevant parameter of the second ion beam 312 to be the base for tuning the second ion beam 312. According to an embodiment, the detection zone 341 of the first detector 34a is larger than the projection region of the second ion beam 312. It is noted that ion moving path from the ion beam generator 31 to the first detector 34a is enclosed by a vacuum container (not shown), and ion implantation is maintained in a vacuum environment to a certain extent.

Figure 4:
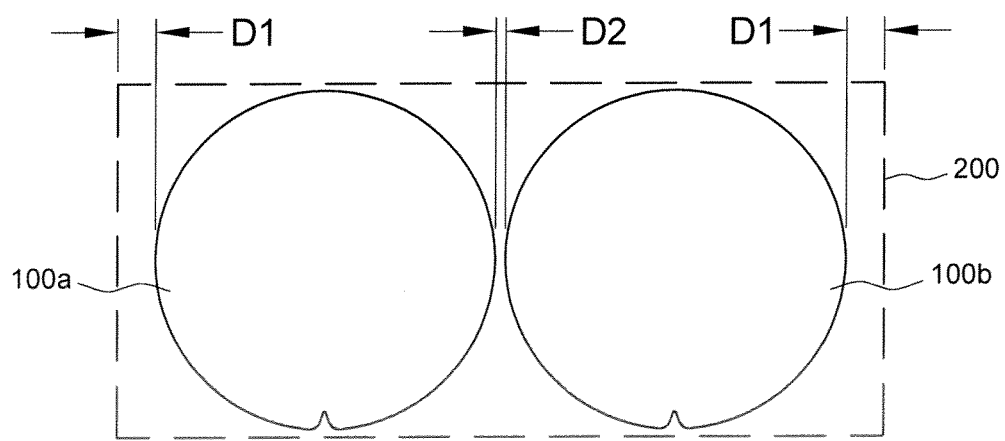
FIG. 4 is a diagram schematically illustrating the relationship between a scanning zone of an ion beam of an ion implanting system according to an embodiment of the present invention and substrates.

Referring also to FIG. 4, suppose the holder device 33 moves from right to left, i.e. the second ion beam 312 scans the substrate 100a, 100b from left to right, the distance D1 on the left side of the figure reserves a buffer zone for acceleration. When the holder device 33 continues to move leftward, the second ion beam 312 scan across the left substrate 100a, and continues to scan across the right substrate 100b. When reaching the right edge of the substrate 100b, the distance D1 on the right side provides a buffer zone for deceleration that is used to prepare for the scan in the opposite direction. Since the buffer zone on the right side of the left substrate 100a and the buffer zone on the left side of the right substrate can be omitted, the utilization rate of the ion beam can be increased relatively.

Figure 1:
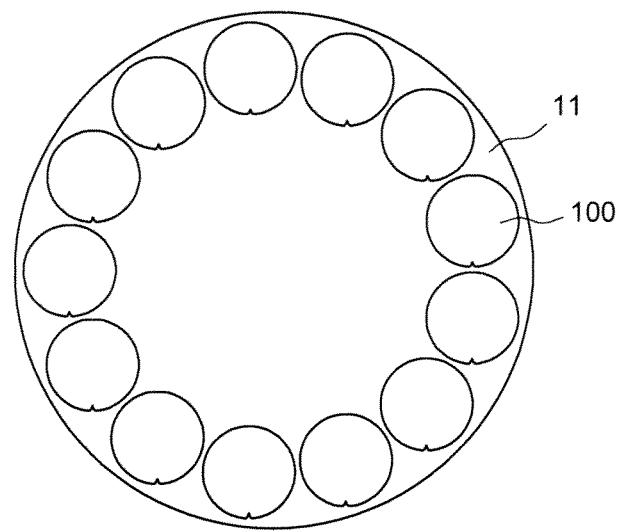
FIG. 1 is a diagram schematically illustrating a prior art ion implanting system for multi-wafer arranged circularly.
Figure 2:
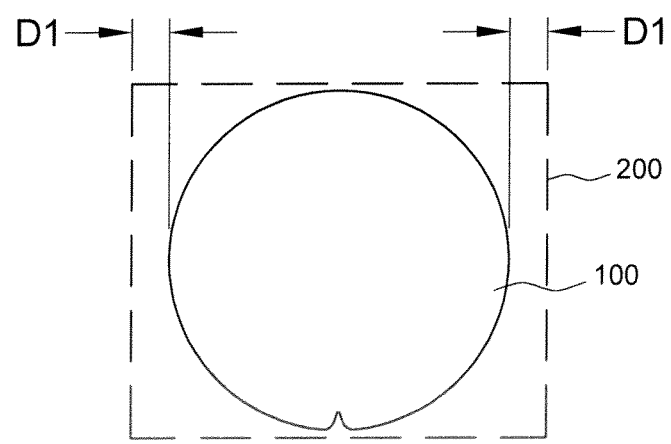
FIG. 2 is a diagram schematically illustrating the relationship between a scanning zone of an ion beam of a prior art ion implanting system for single wafer and a substrate.

For example, in the prior art ion beam scanning zone 200 as shown in FIG. 2, each substrate 100 requires two unit distances D1 for the acceleration/deceleration buffer zone. In the ion beam scanning zone 200 of the present embodiment, the acceleration/deceleration buffer zone required for each substrate is only of one unit distance D1. It is foreseeable that the smaller the distance D2 between the substrates 100a and 100b, the higher the utilization rate of the ion beam. In addition, when more than two substrates are arranged side by side, the acceleration/deceleration buffer zone required for each substrate can be further reduced, which means the utilization rate of the ion beam can be further increased.

Figure 6:
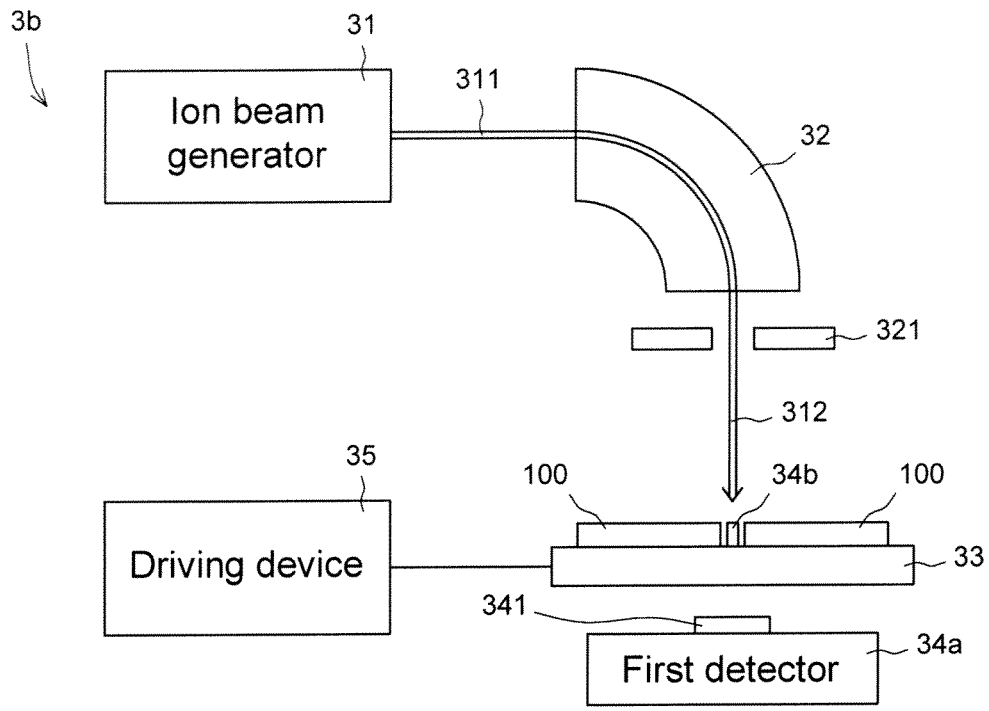
FIG. 6 is a diagram schematically illustrating an ion implanting system according to yet another embodiment of the present invention.
Figure 7:
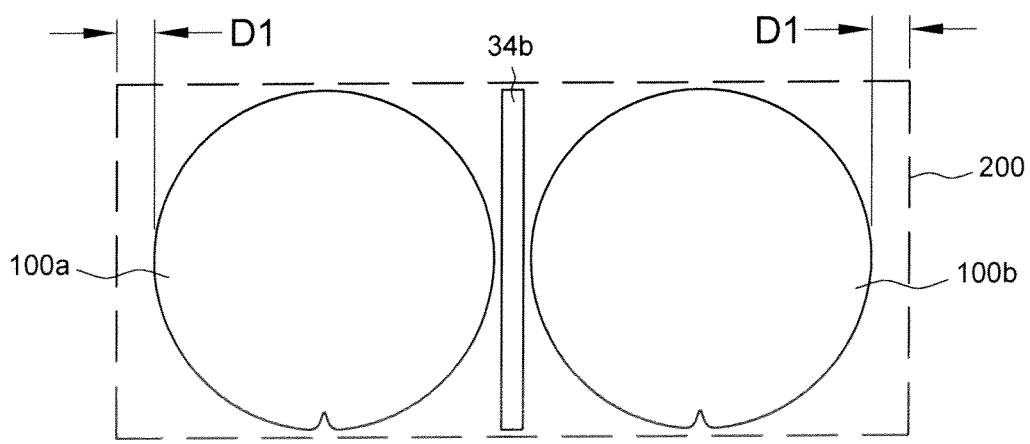
FIG. 7 is a diagram schematically illustrating the relationship between a scanning zone of an ion beam of an ion implanting system according to an embodiment of the present invention and substrates.

Compared to the embodiment illustrated in FIG. 3, the ion implanting system 3b, in reference to FIG. 6 and FIG. 7, further includes a second detector 34b disposed on the holder device 33 and within the scanning zone of the second ion beam 312. Preferably, the second detector 34b is arranged between the plurality of substrates 100a and 100b. According to an embodiment, because the holder device 33 and the second ion beam 312 move in relative to each other, even the detection zone of the second detector 34b is smaller than the projection region of the second ion beam 312, the second detector 34b can still scan across the projection region of the second ion beam 312 to obtain the complete relevant parameters of the second ion beam 312. The second detector 34b can acquire the relevant parameters during ion implantation, and therefore, the ion implanting system 3b can adjust the fabrication parameters such as the scanning speed and scanning range of the driving device 35 in a real time manner based on the acquired relevant parameters of the second ion beam 312 by the second detector 34b.

To summarize the foregoing descriptions, the ion implanting system of the present invention performs ion implantation on a plurality of substrates arranged side by side. Because there is no need to change the direction of scanning between substrates, the acceleration/deceleration buffer zone between the substrates can be omitted to increase the utilization rate of the ion beam. Moreover, by configuring the second detector on the holder device, the real time relevant parameters of the second ion beam can be acquired, thereby enabling the ion implanting system of the present invention to adjust the fabrication parameters in real time. Another important feature of the second detector 34b is to allow the ion implanting system 3b to capture the entire ion beam which might be missed by the first detector 34a when the projection region of the ion beam exceeded the detection zone of the first detector 34a.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. An ion implanting system comprising:
an ion beam generator configured for generating a first ion beam;
a mass separation device arranged at the downstream side of the first ion beam and configured for isolating a second ion beam comprising required ions from the first ion beam;
a holder device arranged at the downstream side of the second ion beam and configured for holding a plurality of substrates, wherein the holder device and the second ion beam linearly reciprocate relative to each other along a first direction to make the plurality of substrates pass across a projection region of the second ion beam while ion implanting, and the plurality of substrates are arranged side by side along the first direction; and a first detector arranged at the downstream side of the second ion beam and configured for obtaining relevant parameters of the second ion beam.

2. The ion implanting system according to claim 1, further comprising:

a second detector arranged on the holder device and within the projection region of the second ion beam, and configured for obtaining the relevant parameters of the second ion beam.

3. The ion implanting system according to claim 2, wherein the second detector is arranged between the plurality of substrates.

4. The ion implanting system according to claim 2, wherein the detection zone of the second detector is smaller than the projection region of the second ion beam.

5. The ion implanting system according to claim 1, wherein the detection zone of the first detector is larger than the projection region of the second ion beam.

6. The ion implanting system according to claim 1, further comprising:

a driving device connected with the holder device, and configured for driving the holder device reciprocating along the first direction.

7. The ion implanting system according to claim 6, wherein the driving device is further configured for driving the holder device moving along a second direction, wherein the second direction is parallel to the plane where the substrate lies, or at an angle to the plane.

8. The ion implanting system according to claim 1, further comprising:

a scanning device arranged between the mass separation device and the holder device, and configured for deflecting the second ion beam to pass across the plurality of the substrates in a reciprocating manner.

9. The ion implanting system according to claim 8, further comprising:

a driving device connected with the holder device, and configured for moving the holder device along a second direction, wherein the second direction is parallel to the plane where the substrate lies, or at an angle to the plane.

10. The ion implanting system according to claim 1, wherein the second ion beam is ribbon-shaped or bell-shaped.

11. The ion implanting system according to claim 1, wherein the relevant parameter of the second ion beam comprises the parallelism, incident angle, ion beam density, ion beam profile shape of the second ion beam, or the combination thereof.

12. The ion implanting system according to claim 1, wherein the substrate comprises a semiconductor wafer.

* * * * *